(12) United States Patent
Hsu et al.

(10) Patent No.: US 8,199,287 B2
(45) Date of Patent: Jun. 12, 2012

(54) PIXEL STRUCTURE OF A TRANSFLECTIVE LIQUID CRYSTAL DISPLAY PANEL AND METHOD OF MAKING THE SAME

(75) Inventors: Shih-Chia Hsu, Hsin-Chu (TW); Hsiang-Lin Lin, Hsin-Chu (TW); Ching-Huan Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 587 days.

(21) Appl. No.: 12/499,801

(22) Filed: Jul. 9, 2009

(65) Prior Publication Data
US 2010/0123862 A1   May 20, 2010

(30) Foreign Application Priority Data
Nov. 17, 2008 (TW) .............................. 97144353 A

(51) Int. Cl.
*G02F 1/1335* (2006.01)

(52) U.S. Cl. ............................ 349/114; 349/38; 349/138
(58) Field of Classification Search .................. 349/114, 349/143, 38, 43, 139, 138, 187, 113; 438/30; 257/E21.158, 72, E33.064
See application file for complete search history.

(56) References Cited

U.S. PATENT DOCUMENTS

| 7,486,360 B2 * | 2/2009 | Kim ............................... 349/114 |
| 2006/0268186 A1 | 11/2006 | Kamada et al. |

* cited by examiner

*Primary Examiner* — Thoi Duong
(74) *Attorney, Agent, or Firm* — Winston Hsu; Scott Margo

(57) ABSTRACT

A pixel structure of a transflective liquid crystal display panel. The pixel structure has single cell gap design, but a coupling capacitor and a modulating capacitor are properly connected to the reflection electrode so as to modulate the voltage of the reflection electrode. Consequently, the transmission region and reflection region of the pixel structure have substantially consistent gamma curves.

13 Claims, 12 Drawing Sheets

PIXEL STRUCTURE OF A TRANSFLECTIVE LIQUID CRYSTAL DISPLAY PANEL AND METHOD OF MAKING THE SAME

BACKGROUND OF THE INVENTION

1. Field of the Invention

The present invention relates to a pixel structure of a transflective liquid crystal display (TR-LCD) panel and a method of making the same, and more particularly, to an amorphous silicon thin-film transistor (a-Si TFT), which has a pixel structure having a single cell gap, and a method of making the same.

2. Description of the Prior Art

The LCDs are mainly categorized into three types such as transmissive type LCDs, reflective type LCDs and transflective type LCDs due to their different types of illumination sources. The transmissive type LCD panel usually has a backlight source disposed therein so that the transmissive type LCD panel can be provided with illumination lights. The emitting lights coming from the backlight source can penetrate through the transmissive type LCD panel and therefore the viewers can see colorful display images created by the transmissive type LCD. The reflective type LCD panel has a reflection electrode disposed therein so that the ambient lights entering into the reflective type LCD panel from the display plane of the reflective type LCD panel can be reflected by the reflection electrode. Afterwards, the reflected lights will penetrate through the reflective type LCD panel again and therefore the viewers can see the display images created by the reflective type LCD. The transflective type LCD (TR-LCD) is a kind of LCD having both of the characteristics of the reflective type LCD and the transmissive type LCD. In other words, the TR-LCD can be operated either in reflective mode or operated in transmissive mode. In such a case, it is therefore that each pixel region of the TR-LCD panel includes a transmission region and a reflection region. The transmission region is illuminated by the backlight source, and the reflection region is illuminated by the ambient lights.

Conventional TR-LCD panels can be further classified into a single cell gap TR-LCD panel and a dual cell gap TR-LCD panel. The cell gap of the reflection region of the single cell gap TR-LCD panel is identical to that of the transmission region of the single cell gap TR-LCD panel. However, since the light path difference of the ambient light of the reflection region is not identical to that of the backlight source of the transmission region, the gamma curve of the reflection region is accordingly not identical to that of the transmission region. Consequently, an optimized optical efficiency operated either in reflective mode or operated in transmissive mode can not be looked after. The dual cell gap TR-LCD panel is different from the single cell gap TR-LCD panel. The cell gap of the reflection region of the dual cell gap TR-LCD panel is substantially about half of the cell gap of the transmission region of the dual cell gap TR-LCD panel so that the ambient lights of the reflection region and the backlight source of the transmission region substantially have the same light path difference. In such a case, the transmission region and reflection region have substantially consistent gamma curves. However, since the cell gap of the dual cell gap TR-LCD panel must be adjusted by virtue of arranging additional bumps in the reflection region, an additional manufacturing process should be performed for forming the bumps. As a consequence, the complexity of the manufacturing process and the production cost will increase.

SUMMARY OF THE INVENTION

One object of the present invention is to provide a pixel structure of a TR-LCD panel so that the production cost can be lowered, the complexity of the manufacturing process can be decreased, and the optimized optical efficiency of the reflection region and the transmission region can be obtained.

To achieve the aforementioned object, the present invention provides a pixel structure of a TR-LCD panel. The pixel structure of a TR-LCD panel includes a first substrate, a first metal pattern, a first dielectric layer, a second metal pattern, a second dielectric layer, a reflection electrode and a transmission electrode. The first substrate includes a reflection region and a transmission region. The first metal pattern disposed on the first substrate includes a gate electrode, a first metal electrode, a second metal electrode and a third metal electrode. The gate electrode is disposed in the reflection region. The first metal electrode disposed in the reflection region has a first voltage, the second metal electrode disposed in the reflection region has a second voltage, and the third metal electrode is disposed in the reflection region. The first dielectric layer is disposed on the first substrate and the first metal pattern. The second metal pattern disposed on the first dielectric layer includes a source electrode, a drain electrode, an extension electrode, a fourth metal electrode and a fifth metal electrode. The source electrode and the drain electrode are disposed in the reflection region and respectively corresponding to the two opposite sides of the gate electrode. The extension electrode is electrically connected to the drain electrode and extending to a part of transmission region. The fourth metal electrode is disposed in the reflection region, and the fourth metal electrode is electrically connected to the drain electrode and the third metal electrode. The fourth metal electrode partially overlaps with the first metal electrode to form a storage capacitor. The fifth metal electrode disposed in the reflection region is floating. The fifth metal electrode partially overlaps with the third metal electrode to form a coupling capacitor. The fifth metal electrode partially overlaps with the second metal electrode to form a modulating capacitor. The second dielectric layer is disposed on the first dielectric layer and the second metal pattern. The reflection electrode is disposed on the second dielectric layer in the reflection region, and the reflection electrode is electrically connected to the fifth metal electrode. The transmission electrode is disposed on the second dielectric layer, and the transmission electrode in the transmission region is electrically connected to the extension electrode.

To achieve the aforementioned object, the present invention further provides a method of forming a pixel structure of a TR-LCD panel. The method includes steps as follows. A first substrate is provided, and a reflection region and a transmission region are defined on the first substrate. A first metal pattern is formed on the first substrate. The first metal pattern includes a gate electrode disposed in the reflection region, a first metal electrode disposed in the reflection region, a second metal electrode disposed in the reflection region and a third metal electrode disposed in the reflection region. A first dielectric layer is formed on the first substrate and the first metal pattern, and a first contact hole is formed in the first dielectric layer to expose a part of the third metal electrode. A second metal pattern is formed on the first dielectric layer. The second metal pattern includes a source electrode and a drain electrode disposed in the reflection region and respectively corresponding to the two opposite sides of the gate electrode, an extension electrode electrically connected to the drain electrode and extending to a part of transmission region, a fourth metal electrode disposed in the reflection region and electrically connected to the drain electrode, and a fifth metal electrode disposed in the reflection region. The fourth metal electrode is electrically connected to the third metal electrode via the first contact hole of the first dielectric layer. The fourth metal electrode partially overlaps with the first metal electrode, and the fourth metal electrode and the first metal electrode form a storage capacitor. The fifth metal electrode partially overlaps with the third metal electrode, and the fifth metal electrode and the third metal electrode form a coupling capacitor. Besides, the fifth metal electrode partially overlaps with the second metal electrode, and the fifth metal electrode and the second metal electrode form a modulating capacitor. A second dielectric layer is formed on the first dielectric layer and the second metal pattern, a second contact hole is formed in the second dielectric layer to expose a part of the fifth metal electrode, and a third contact hole is formed expose a part of the extension electrode. A reflection electrode is formed on the second dielectric layer of the reflection region, and the reflection electrode is filled in the second contact hole and is electrically connected to the fifth metal electrode. A transmission electrode is formed on the second dielectric layer in the transmission region, the transmission electrode is filled in the third contact hole, and the transmission electrode is electrically connected to the extension electrode of the drain electrode.

Since the pixel structure of the TR-LCD panel of the present invention utilizes a single cell gap structure, the advantages such as lower complexity of the fabrication process and lower production cost can be obtained. Besides, since the transmission region and the reflection region have similar gamma curves by virtue of disposing a coupling capacitor and a modulating capacitor electrically connected to the reflection electrode, the optical efficiency for both of the transmission region and the reflection region can be optimized.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
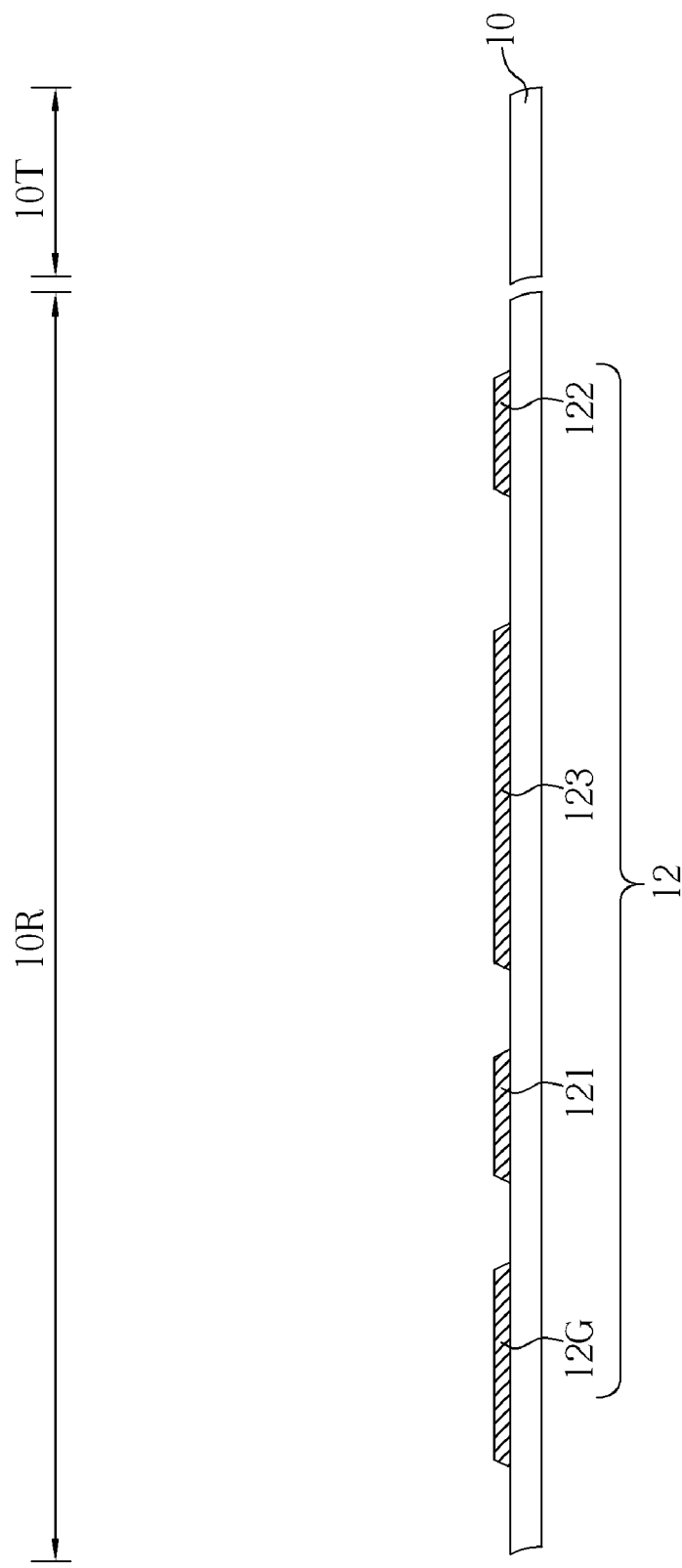
FIG. 1 to FIG. 8 are schematic diagrams illustrating a method of forming a pixel structure of a TR-LCD panel of a preferred embodiment of the present invention.

With reference to FIG. 1 and FIG. 8, FIG. 1 to FIG. 8 are schematic diagrams illustrating a method of forming a pixel structure of a TR-LCD panel of a preferred embodiment of the present invention. As illustrated in FIG. 1, firstly, a first substrate 10 is provided, and a reflection region 10R and a transmission region 10T are defined thereon. The first substrate 10 is a transparent substrate such as a glass substrate, a quartz substrate, or a plastic substrate, which the backlight can penetrate through. After that, a first metal layer such as an aluminum metal layer or another excellent conducting metal layer is formed on the first substrate 10, the first metal layer is defined by virtue of lithography and etching technologies to form a first metal pattern 12 on the first substrate 10. The first metal pattern 12 includes a first metal electrode 121, a second metal electrode 122, a third metal electrode 123, and a gate electrode 12G. Wherein, the first metal electrode 121, the second metal electrode 122, the third metal electrode 123, and the gate electrode 12G is separating from and isolating from each other. In addition, the first metal electrode 121, the second metal electrode 122, the third metal electrode 123, and the gate electrode 12G are disposed in the reflection region 10R.

Figure 2:
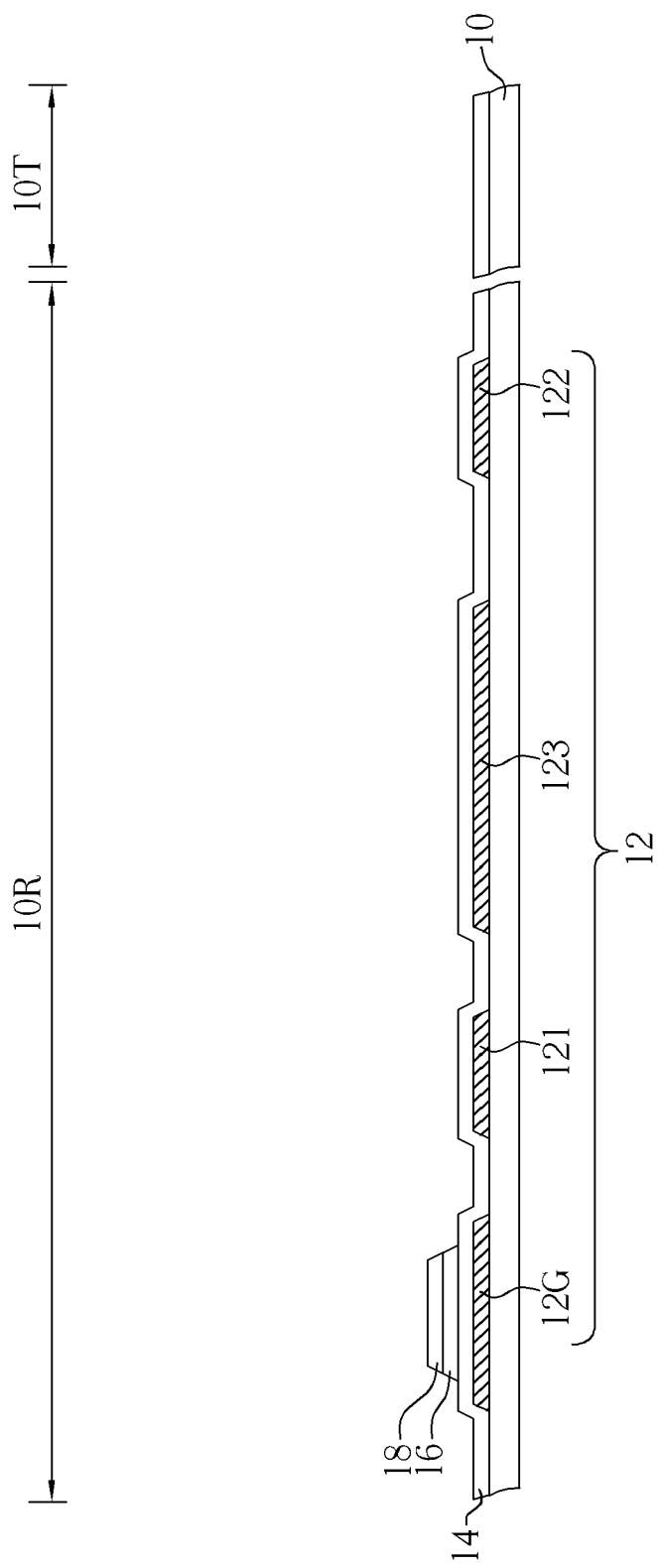

As illustrated in FIG. 2, afterwards, a first dielectric layer 14, an amorphous silicon (or namely amorphous Si, or a-Si) semiconductor layer 16 and a heavily-doped semiconductor layer 18 are sequentially formed on the first substrate 10 and the first metal pattern 12. In addition, the a-Si semiconductor layer 16 and the heavily-doped semiconductor layer 18 are patterned by virtue of lithography and etching technologies. In such a case, the patterned a-Si semiconductor layer 16 and the patterned heavily doped semiconductor layer 18 are corresponding to the gate electrode 12G.

Figure 3:
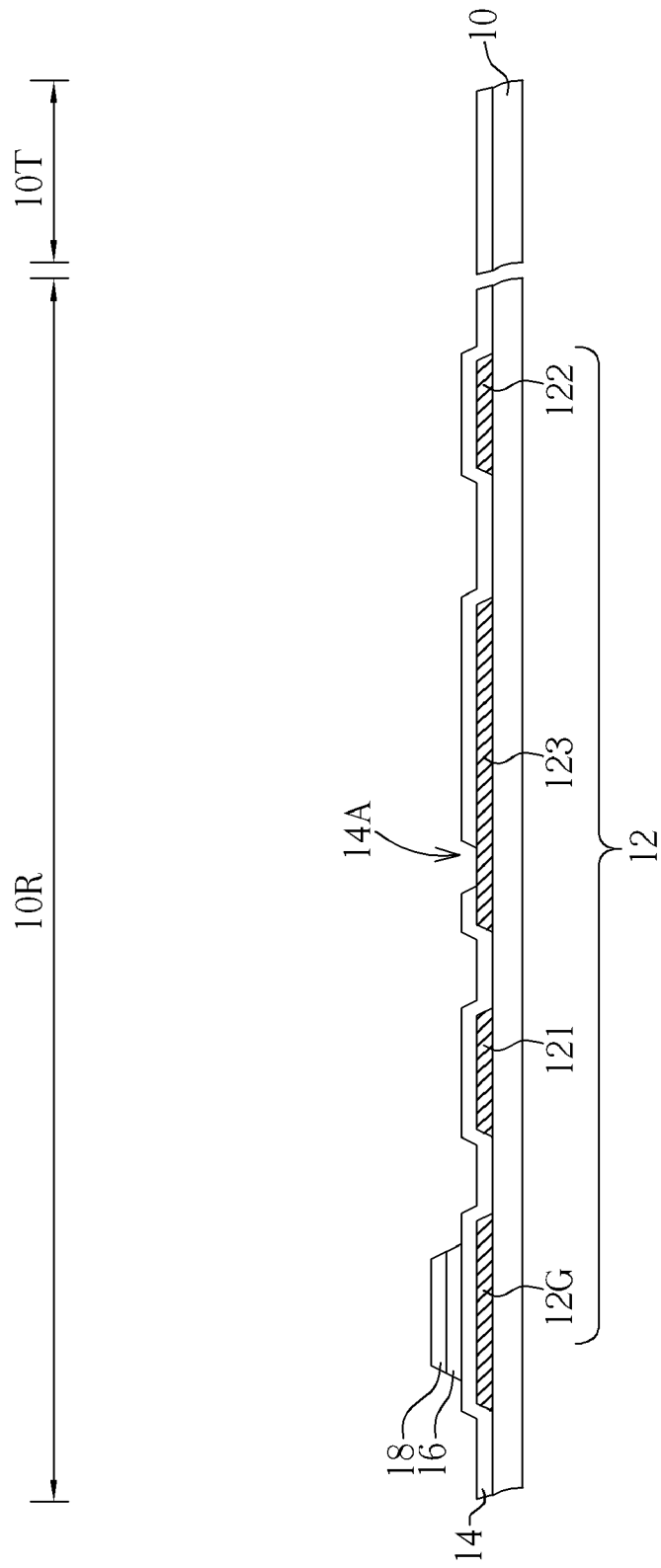

As illustrated in FIG. 3, a part of the first dielectric layer 14 is stripped off by virtue of lithography and etching technologies so as to form a first contact hole 14A in the first dielectric layer 14. Consequently, a part of the third metal electrode 123 is exposed.

Figure 4:
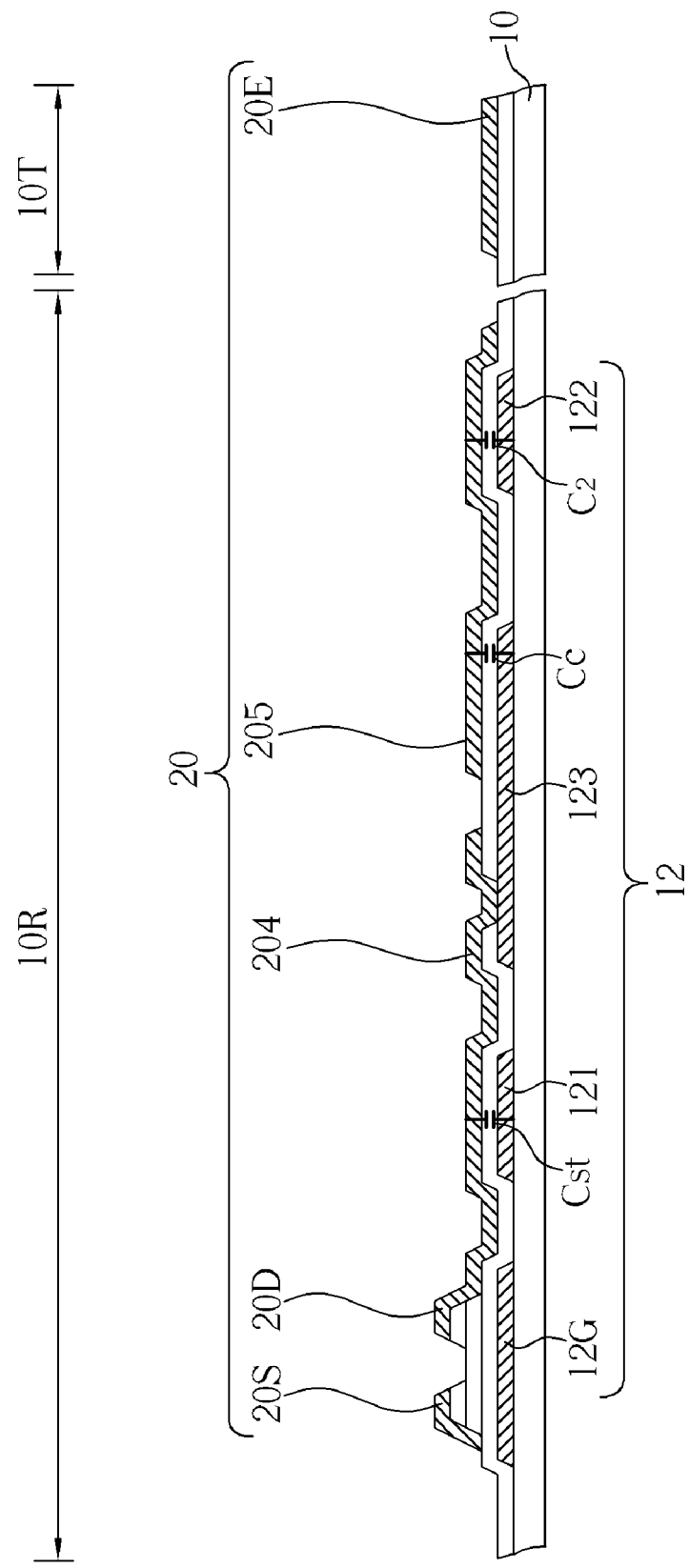

As illustrated in FIG. 4, afterwards, a second metal layer such as an aluminum metal layer or another excellent conducting metal layer is formed on the first dielectric layer 14, and a second metal layer is defined by virtue of lithography and etching technologies so as to form a second metal pattern 20. The second metal pattern 20 includes a source electrode 20S, a drain electrode 20D, an extension electrode 20E, a fourth metal electrode 204, and a fifth metal electrode 205. After that, the exposed heavily-doped semiconductor layer 18 between the source electrode 20S and the drain electrode 20D is subsequently etched out. The source electrode 20S and the drain electrode 20D are disposed in the reflection region 10R and respectively corresponding to the two opposite sides of the gate electrode 12G, and the extension electrode 20E is electrically connected to the drain electrode 20D and extended to a part of transmission region 10T. The fourth metal electrode 204 disposed in the reflection region 10R is electrically connected to the drain electrode 20D, the fourth metal electrode 204 is electrically connected to the third metal electrode 123 via the first contact hole 14A of the first dielectric layer 14. The fifth metal electrode 205 disposed in the reflection region 10R partially overlaps with the third metal electrode 123. Preferably, the fifth metal electrode 205 is separated from and isolated from the fourth metal electrode 204 and the extension electrode 20E.

Figure 5:
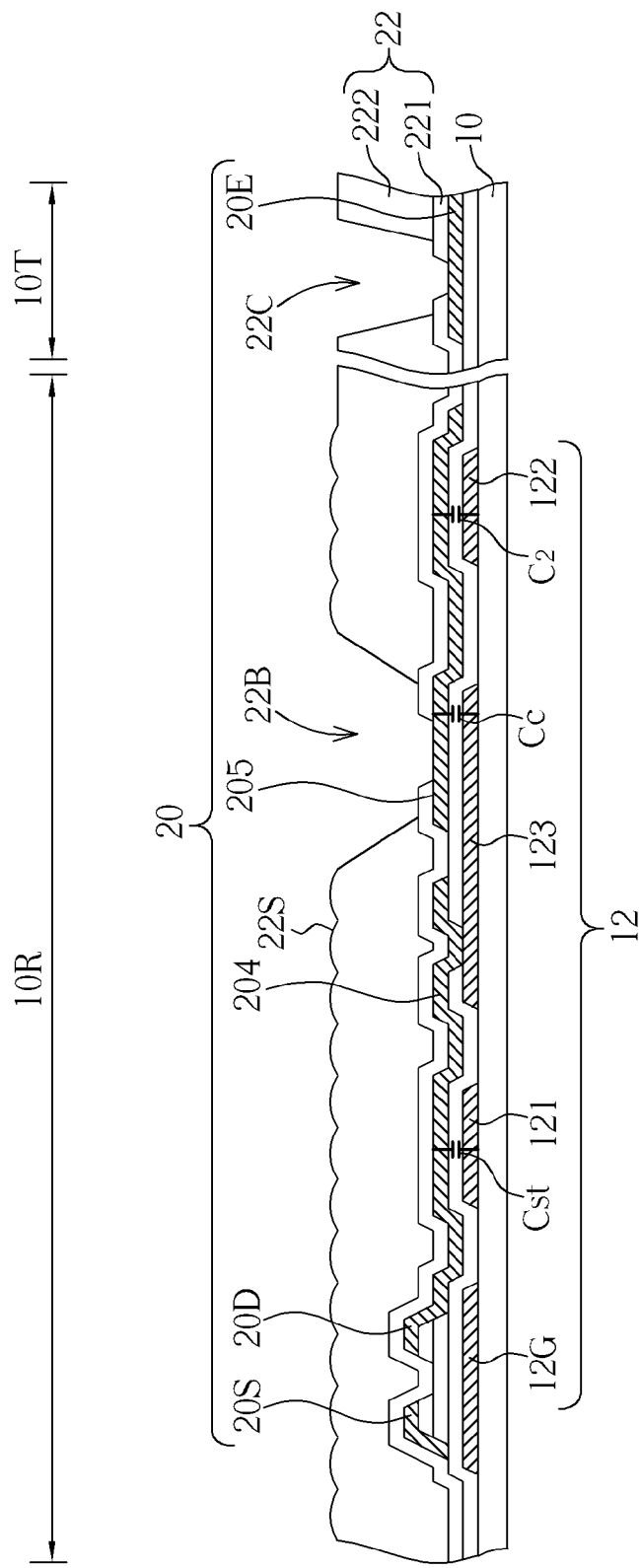

As illustrated in FIG. 5, then, a second dielectric layer 22 is formed on the first dielectric layer 14 and the second metal pattern 20. In this embodiment, the second dielectric layer 22 is a complex structure including inorganic material or organic material but not limited thereto. For instance, the second dielectric layer 22 can alternatively be a single structure or other multilayer structures including other materials. In this embodiment, the steps of forming the second dielectric layer 22 are illustrated as follows. Firstly, an inorganic dielectric layer 221 is formed on the first dielectric layer 14 and the second metal pattern 20, and an organic dielectric layer 222 is subsequently formed on the inorganic dielectric layer 221. After that, a second contact hole 22B and a third contact hole 22C are formed in the second dielectric layer 22 by virtue of exposing, developing and etching processes. The second contact hole 22B exposes a part of the fifth metal electrode 205, and the third contact hole 22C exposes a part of the extension electrode 20E. In addition, in order to enhance the scatter effect of the reflection electrode to be formed subsequently, it is preferable to make the organic dielectric layer 222 of the reflection region 10R has a rough surface 22S when forming the organic dielectric layer 222.

Figure 6:
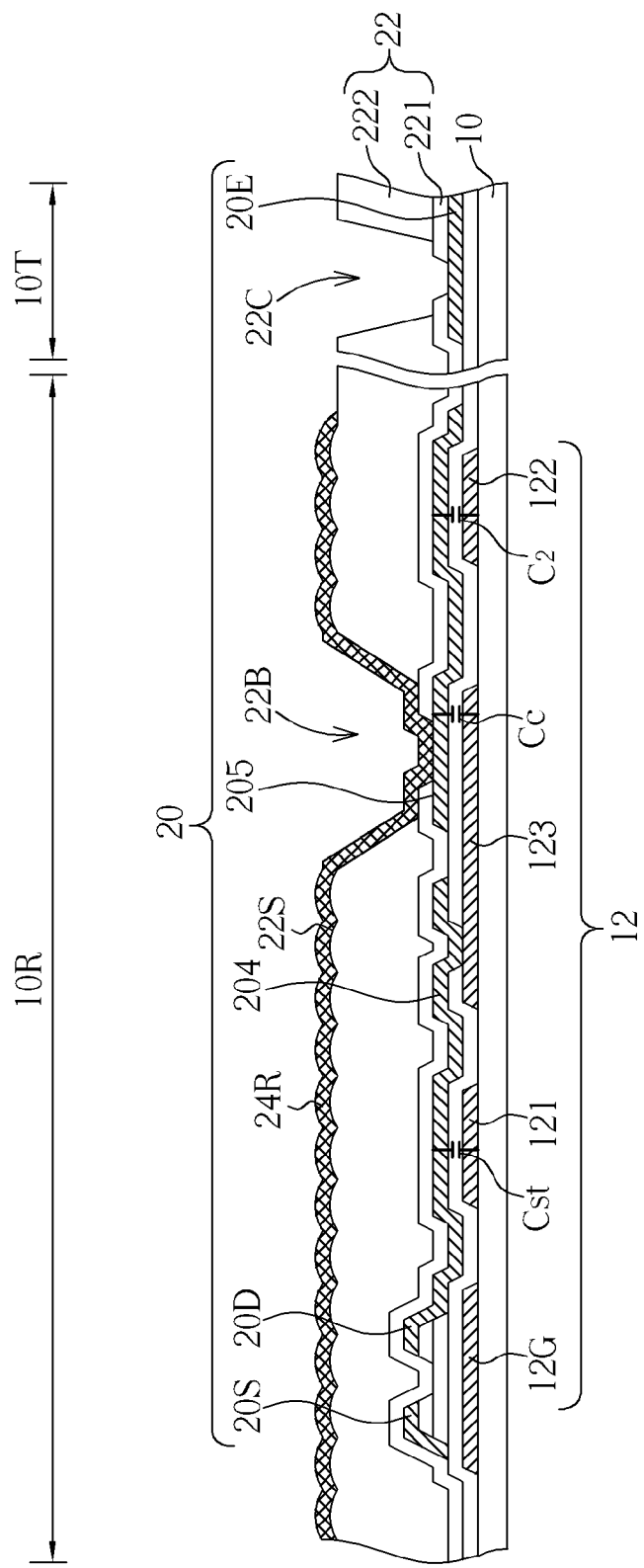

As illustrated in FIG. 6, by virtue of lithography and etching technologies, a metal layer such as an aluminum metal layer is formed on the organic dielectric layer 222, and the metal layer is subsequently patterned to form a reflection electrode 24R on the organic dielectric layer 222 in the reflection region 10R. The reflection electrode 24R is filled in the second contact hole 22B so that the reflection electrode 24R is electrically connected to the fifth metal electrode 205. As described earlier, since the organic dielectric layer 222 has a rough surface 22S thereon, the reflection electrode 24R subsequently formed (or namely conform formed) on the organic dielectric layer 222 can likewise have a rough surface so that the scatter effect can be accordingly enhanced.

Figure 7:
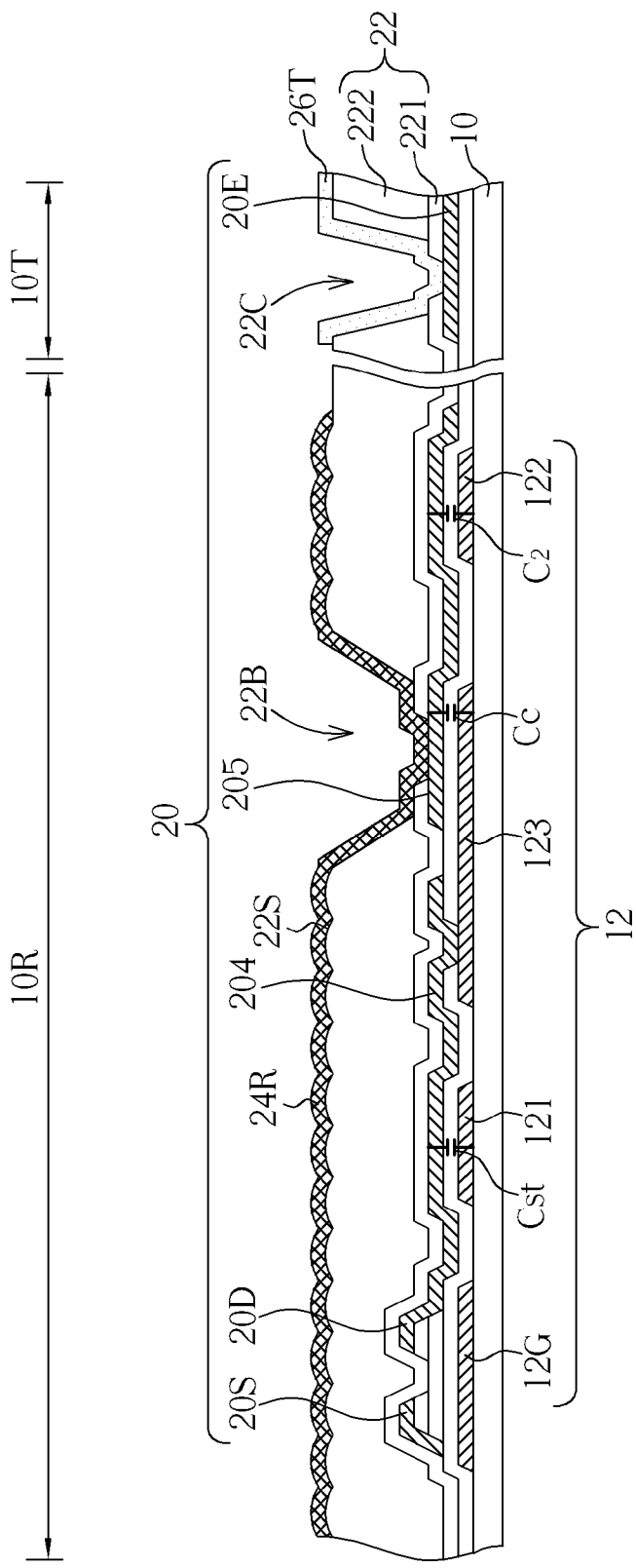

As illustrated in FIG. 7, a transparent conducting layer such as an indium tin oxide (ITO) layer is formed on the organic dielectric layer 222. In addition, by virtue of lithography and etching technologies, the transparent conducting layer is patterned so as to form a transmission electrode 26T on the organic dielectric layer 222 of the transmission region 10T. Besides, the transmission electrode 26T is filled in the third contact hole 22C and therefore electrically connected to the extension electrode 20E. In such a case, the transmission electrode 26T can receive the signals coming from the drain electrode 20D. In this embodiment, the steps of forming the reflection electrode 24R and the transmission electrode 26T are not limited thereto. For instance, the sequence of steps can be swapped. In addition, after the step of forming the reflection electrode 24R and the transmission electrode 26T, necessary manufacturing process for forming the TR-LCD panel e.g. the step of forming an alignment film can be sequentially performed, and is not redundantly described.

Figure 8:
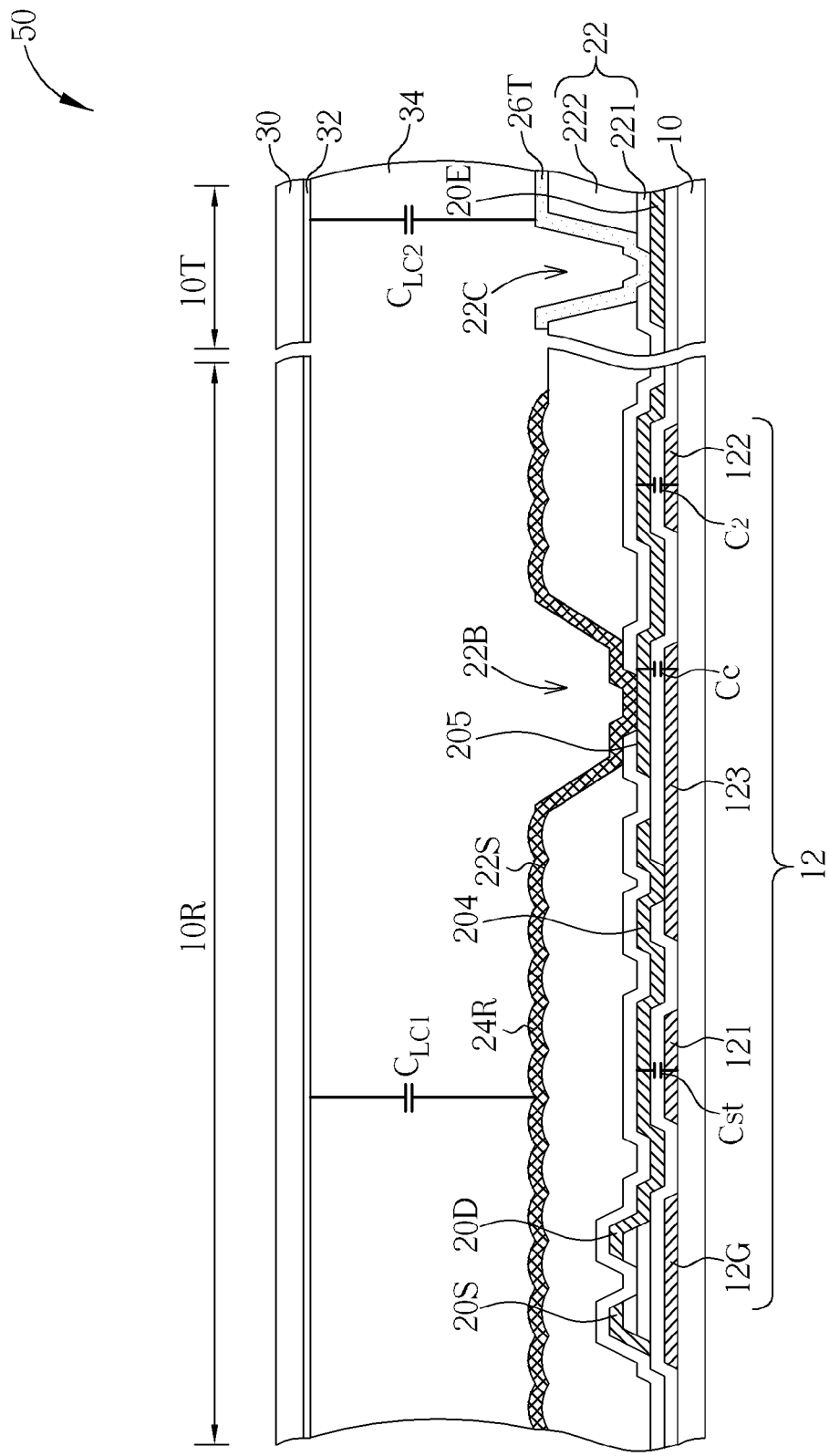

As illustrated in FIG. 8, a second substrate 30 is provided, and a common electrode 32, is formed on the second substrate 30. Wherein the second substrate 30 may be has a black shielding layer (not shown in the figure), a color filter (not shown in the figure), and an alignment film (not shown in the figure). Afterwards, the second substrate 30 and the first substrate 10 are assembled together so that the first substrate 10 is disposed opposite to the second substrate 30. Also, a liquid crystal layer 34 is formed between the first substrate 10 and the second substrate 30. Consequently, the pixel structure 50 of the TR-LCD panel of this embodiment is formed.

Figure 9:
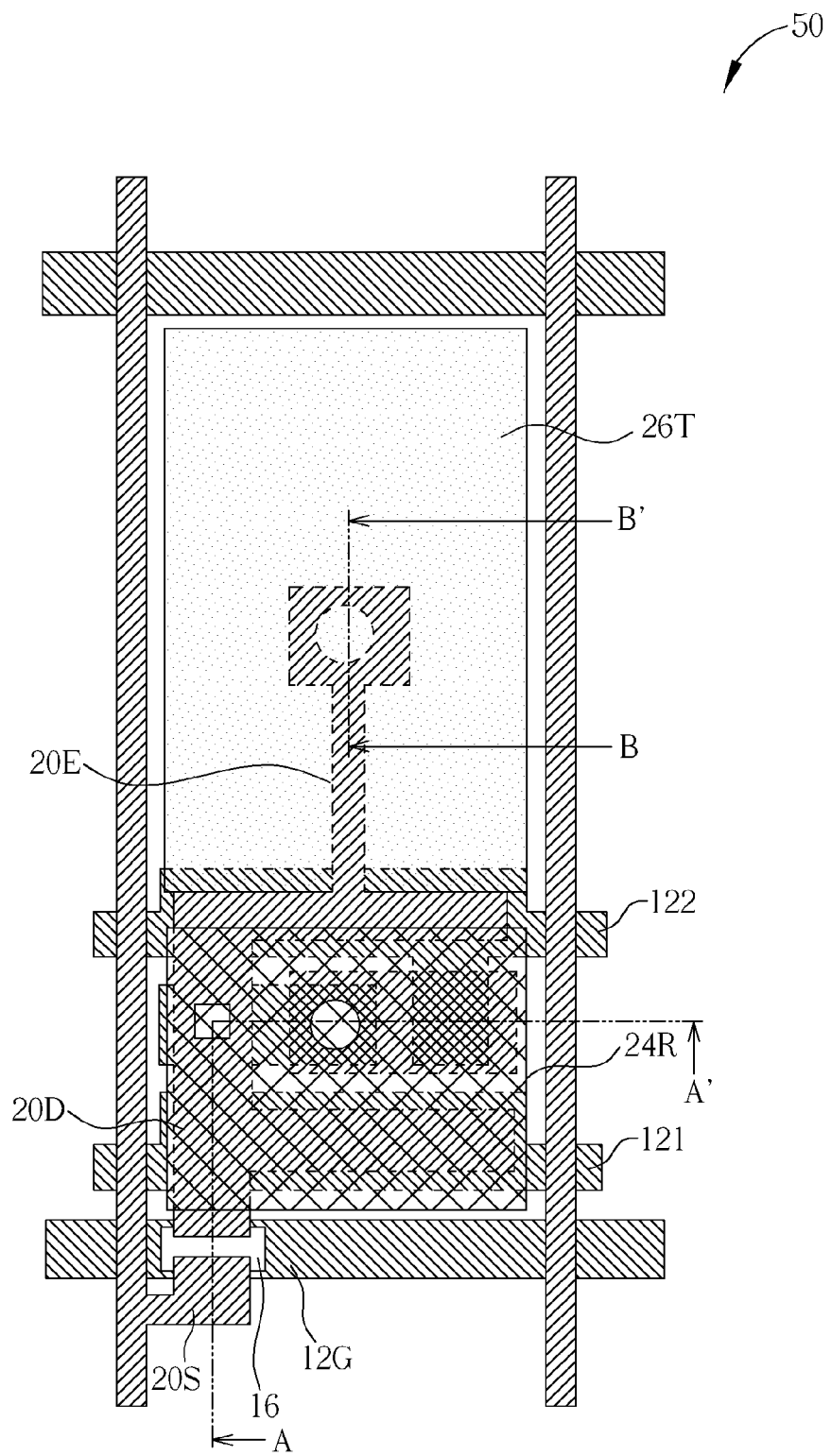
FIG. 9 is a top view of a pixel structure of a TR-LCD panel of the present embodiment.

With reference to FIG. 9 and FIG. 8, FIG. 9 is a top view of the pixel structure of the TR-LCD panel of the present embodiment, and FIG. 8 is a cross-sectional schematic diagram of the pixel structure of the TR-LCD panel of the present embodiment. The reflection region 10R of the pixel structure illustrated in FIG. 8 is a cross-sectional schematic diagram along the tangent line AA' illustrated in FIG. 9, and the transmission region 10T of the pixel structure illustrated in FIG. 8 is a cross-sectional schematic diagram along the tangent line BB' illustrated in FIG. 9. As illustrated in FIG. 8 and FIG. 9, the fourth metal electrode 204 of the second metal pattern 20 partially overlaps with the first metal electrode 121 of the first metal pattern 12 so that a storage capacitor $C_{st}$ between the fourth metal electrode 204 and the first metal electrode 121 is formed in the first dielectric layer 14. Besides, the fifth metal electrode 205 partially overlaps with the third metal electrode 123 of the first metal pattern 12 so that a coupling capacitor $C_C$ between the fifth metal electrode 205 and the third metal electrode 123 is formed in the first dielectric layer 14. In addition, the fifth metal electrode 205 partially overlaps with the second metal electrode 122 so that a modulating capacitor $C_2$ between the fifth metal electrode 205 and the second metal electrode 122 is formed in the first dielectric layer 14. Moreover, a first liquid crystal capacitor $C_{LC1}$ between the transmission electrode 26T and the common electrode 32 is formed in the liquid crystal layer 34. Likewise, a second liquid crystal capacitor $C_{LC2}$ between the reflection electrode 24R and the common electrode 32 is formed in the liquid crystal layer 34. In addition, in this embodiment, the common electrode 32 and the first metal electrode 121 of the first metal pattern 12 has a first voltage $V_{com1}$, the second metal electrode 122 of the first metal pattern 12 has a second voltage $V_{com2}$, and the fifth metal electrode 205 of the second metal pattern 20 is floating, electrically disconnected to any voltage source.

The TR-LCD in this embodiment has a single cell gap design. However, by virtue of disposing the coupling capacitor $C_C$ and the modulating capacitor $C_2$ electrically connected to the reflection electrode 24R properly, the transmission region 10T and the reflection region 10R will have similar gamma curves. Since an additional manufacturing process is needless to form a dual cell gap, the manufacturing process is simplified. Besides, compared with low temperature polysilicon thin film transistors (LTPS-TFTs), the TR-LCD panel of this embodiment utilizes a-Si TFTs fabricated by simplified manufacturing process so that the production capacity and the yield can be increased. The circuit design of the pixel structure of the TR-LCD panel of the present invention will be detailed as follows.

Figure 10:
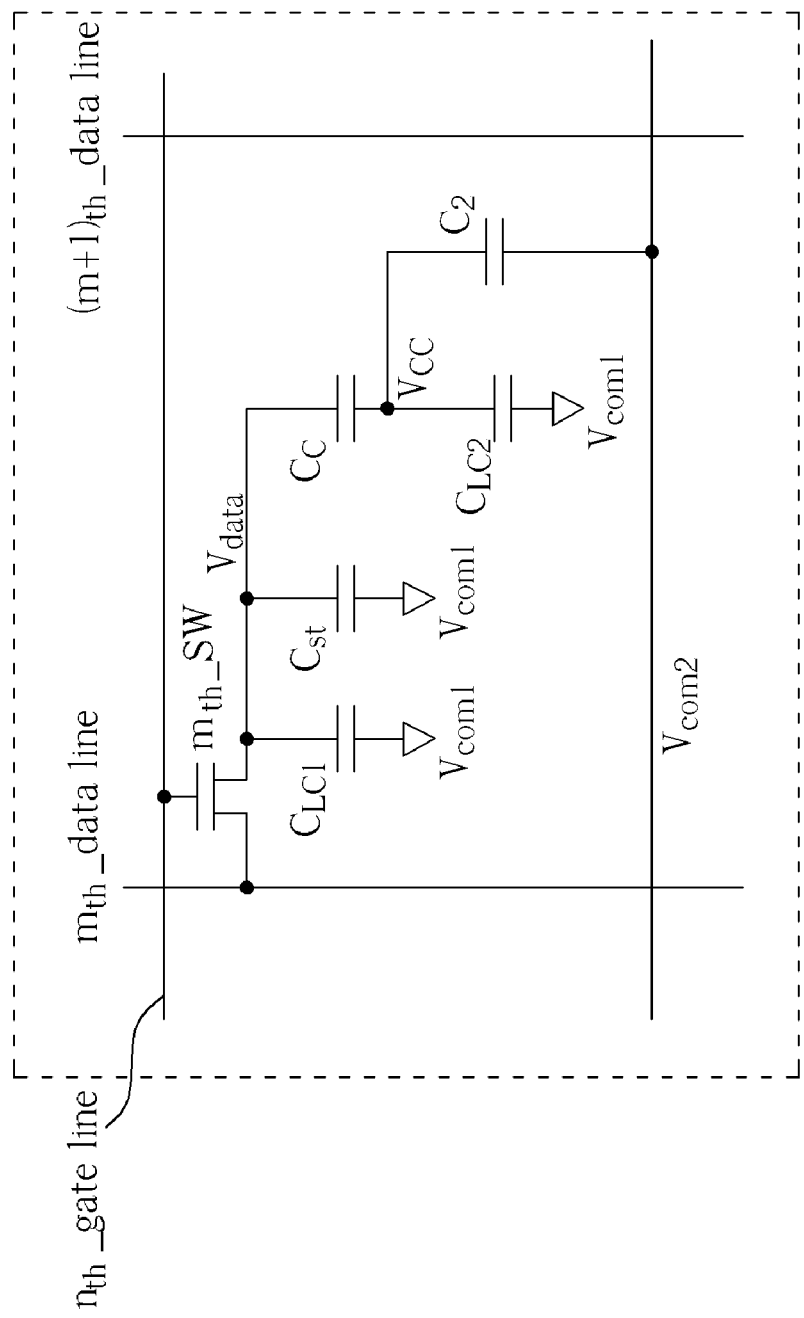
FIG. 10 is an equivalent circuit diagram of a pixel structure of a TR-LCD panel of the present invention.

With reference to FIG. 10, FIG. 8 and FIG. 9, FIG. 10 is an equivalent circuit diagram of a pixel structure of a TR-LCD panel of the present invention. As illustrated in FIG. 10, each of the pixel structure 50 includes a first liquid crystal capacitor $C_{LC1}$, a storage capacitor $C_{St}$, a coupling capacitor $C_C$, a modulating capacitor $C_2$, and a second liquid crystal capacitor $C_{LC2}$. The first liquid crystal capacitor $C_{LC1}$ consists of the transmission electrode 26T, the common electrode 32 and the liquid crystal layer 34. The storage capacitor $C_{st}$ is formed by the fourth metal electrode 204, the first metal electrode 121 and the first dielectric layer 14. The coupling capacitor $C_C$ is formed by the fifth metal electrode 205, the third metal electrode 123, and the first dielectric layer 14. The modulating capacitor $C_2$ is formed by of the fifth metal electrode 205, the second metal electrode 122 and the first dielectric layer 14. The second liquid crystal capacitor $C_{LC2}$ is formed by the reflection electrode 24R, the common electrode 32 and the liquid crystal layer 34. The transmission electrode 26T of the first liquid crystal capacitor $C_{LC1}$ is electrically connected to the drain electrode of the switching device mth_SW. In this embodiment, the switching device, implemented by a-Si TFT, can receive the voltage coming from the data line mth_data line, and the common electrode 32 has the first voltage $V_{com1}$. The fourth metal electrode 204 of the storage capacitor $C_{st}$ is electrically connected to the drain electrode of the switching device mth_SW and can receive the voltage coming from the mth_data line. In addition, the first metal electrode 121 has the first voltage $V_{com1}$. The third metal electrode 123 of the coupling capacitor $C_C$ is electrically connected to the drain electrode of the switching device mth_SW and can receive the voltage coming from the data line mth_data line. The fifth metal electrode 205 of the modulating capacitor $C_2$ is floating, and the second metal electrode 122 has the second voltage $V_{com2}$. The reflection electrode 24R of the second liquid crystal capacitor $C_{LC2}$ is electrically connected to the fifth metal electrode 205 and is floating. Besides, the common electrode 32 has the first voltage $V_{com1}$.

From aforementioned description we know, the transmission electrode 26T of the first liquid crystal capacitor $C_{LC1}$ used to drive the transmission region 10T is electrically connected to the drain electrode of the switching device mth_SW directly and can be controlled by the signals coming from the mth_data line. On the other hand, the reflection electrode 24R of the second liquid crystal capacitor $C_{LC2}$ used to control the reflection region 10R is not electrically connected to the drain electrode of the switching device mth_SW directly but electrically connected to the fifth metal electrode 205 of the coupling capacitor $C_C$ and the modulating capacitor $C_2$. In such a case, the reflection electrode 24R and the transmission electrode 26T have different voltages so that the transmission region 10T and the reflection region 10R have substantially consistent gamma curves.

According to Kirchhoff's Current Law, the voltage $V_{CLC2}$ of the second liquid crystal capacitor $C_{LC2}$ of the reflection region 10R of the pixel structure of the TR-LCD panel of the this embodiment can be represented by the following formula:

$$|V_{CLC2}| = |V_{CC} - V_{COM1}| = \left| \frac{C_C}{C_{LC2} + C_C + C_2} \times (V_{data} - V_{COM1}) + \frac{C_2}{C_{LC2} + C_C + C_2} \times (V_{COM2} - V_{COM1}) \right|$$

In another words, by virtue of disposing the coupling capacitor $C_C$ and the modulating capacitor $C_2$ and adjusting the proportionate relationship between the coupling capacitor $C_C$, the modulating capacitor $C_2$ and the second liquid crystal capacitor $C_{LC2}$, the voltage $V_{CLC2}$ of the second liquid crystal capacitor $C_{LC2}$ can be adjusted so that the reflection region 10R and the transmission region 10T have substantially consistent gamma curves.

Figure 11:
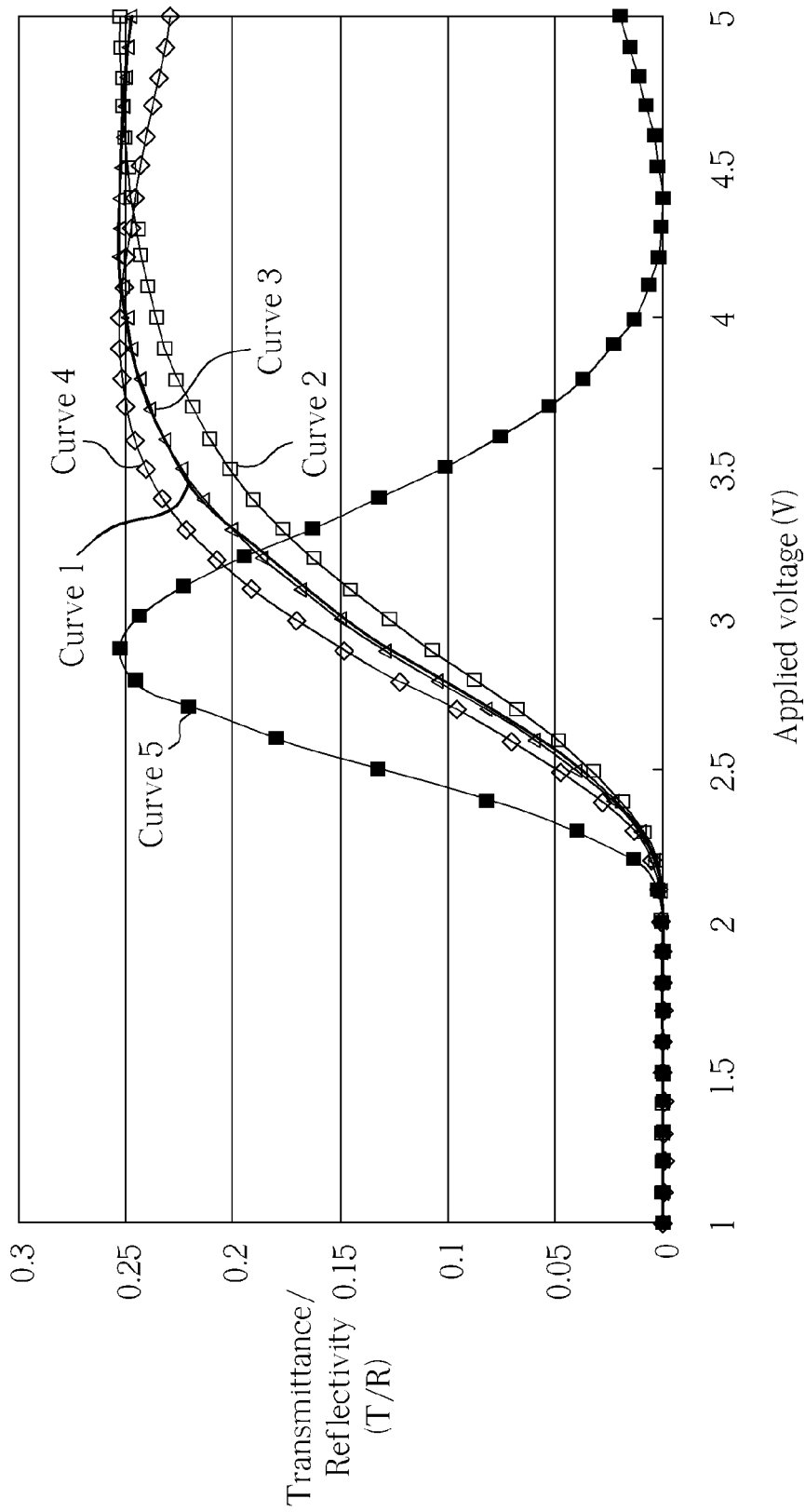
FIG. 11 depicts a relationship diagram of transmittance (T) or reflectivity (R) versus applied voltage (V) of a pixel structure of the TR-LCD panel with different cell gaps.

With reference to FIG. 11, FIG. 11 depicts a relationship diagram of transmittance (T) or reflectivity (R) versus applied voltage (V) of a pixel structure of the TR-LCD panel with different cell gaps. As illustrated in FIG. 11, curve 1 depicts a relationship diagram of the transmittance (T) versus applied voltage (V) of the transmission region when the cell gap is substantially about 4 μm. Curve 2 depicts a relationship diagram of the reflectivity (R) versus applied voltage (V) of the reflection region of the dual cell gap structure when the cell gap is substantially about 1.8 μm. Curve 3 depicts a relationship diagram of the reflectivity (R) versus applied voltage (V) of the reflection region of the dual cell gap structure when the cell gap is substantially about 2 μm. Curve 4 depicts a relationship diagram of the reflectivity (R) versus applied voltage (V) of the reflection region of the dual cell gap structure when the cell gap is substantially about 2.2 μm. Curve 5 depicts a relationship diagram of the reflectivity (R) versus applied voltage (V) of the reflection region of the single cell gap structure when the cell gap is substantially about 4 μm. As illustrated in FIG. 11, when it comes to the conventional single cell gap structure, the relationship of the transmittance versus applied voltage of the transmission region is different from the relationship of the reflectivity versus applied voltage of the reflection region. For example, curve 1 and curve 5 can be compared with each other as the cell gap of the reflection region and the transmission region is substantially about 4 μm. Please refer to and compares with the curve 1 and curve 5, for example, when the transmittance and reflectivity arrive to the max value 0.25, the applied voltage of the transmission region depicted according to curve 1 is substantially about 4.2 V but the applied voltage of the reflection region depicted according to curve 5 is substantially about 2.8 V. Therefore, the optical efficiency for both of the reflection region and the transmission region cannot be optimized when the conventional single cell gap structure is used. On the contrary, when the dual cell gap structure is used, the relationship of the transmittance versus applied voltage of the transmission region is similar to that of the transmittance versus applied voltage of the reflection region. Especially, when the cell gap of the reflection region is half of the cell gap of the transmission region, the light path difference of the reflection region is identical to that of the transmission region. Consequently, as depicted in curve 1 and curve 3, the relationship of transmittance versus applied voltage of the transmission region approximates to the relationship of transmittance versus applied voltage of the transmission region.

Figure 12:
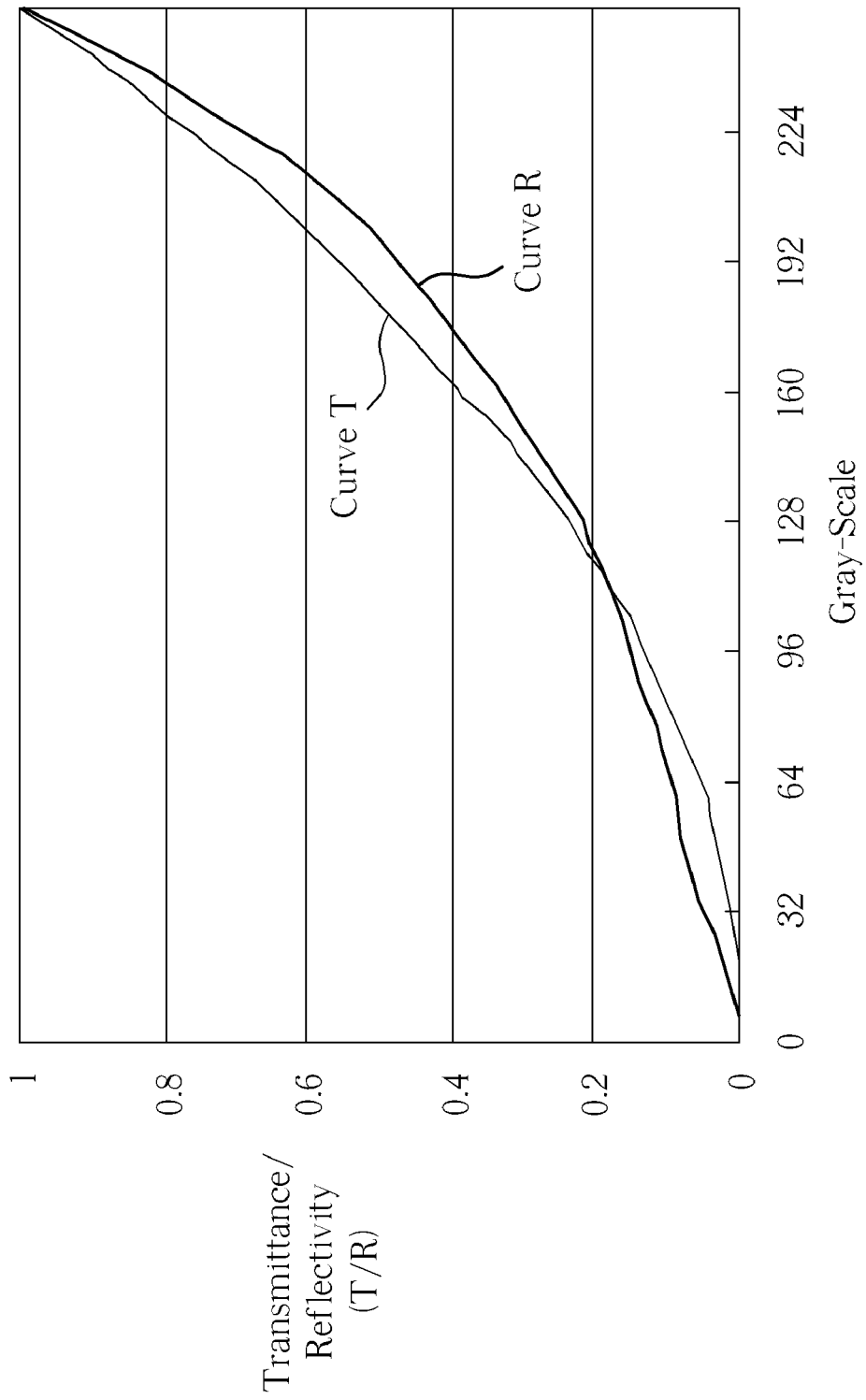
FIG. 12 depicts a relationship diagram of transmittance versus gray-scale of the pixel structure of a single TR-LCD panel of the present invention.

In order to achieve the optimal optical efficiency either in reflective mode or in transflective mode, the coupling capacitor $C_C$ and the modulating capacitor $C_2$ are integrated into the standard process of the pixel structure of the TR-LCD panel according to the present invention. In such a case, an additional manufacturing process for forming dual cell gap is not required. Consequently, the gamma curves of the reflection region can be adjusted by the aforementioned method. With reference to FIG. 12, FIG. 12 depicts a relationship diagram of transmittance versus gray-scale of the pixel structure of a single TR-LCD panel of the present invention. Curve T represents the gamma curve of the transmission region, and the gamma curve R represents the gamma curve of the reflection region. As illustrated in FIG. 12, the transmission region and the reflection region of the pixel structure of the TR-LCD panel of the present invention have substantially consistent gamma curves with the use of the single cell gap structure. Consequently, the desired optical efficiency for both of the reflection region and the transmission region can be looked after.

In summary, the pixel structure of a TR-LCD panel of the present invention has following advantages:
1. The objects of the low-complexity manufacturing process and the low production cost can be achieved by adopting a single cell gap structure.
2. The transmission region and the reflection region have substantially similar gamma curves so that the optical efficiency for both of the reflection region and the transmission region can be considered.
3. The use of a-Si TFT fabrication process increases the production capacity and the yield.

Those skilled in the art will readily observe that numerous modifications and alterations of the device and method may be made while retaining the teachings of the invention.

What is claimed is:

1. A pixel structure of a transflective liquid crystal display (TR-LCD) panel comprising:
   a first substrate comprising a reflection region and a transflective region;
   a first metal pattern disposed on the first substrate, the first metal pattern comprising:
      a gate electrode disposed in the reflection region;
      a first metal electrode disposed in the reflection region having a first voltage;
      a second metal electrode disposed in the reflection region having a second voltage;
      a third metal electrode disposed in the reflection region;
   a first dielectric layer disposed on the first substrate and the first metal pattern;
   a second metal pattern disposed on the first dielectric layer, the second metal pattern comprising:

a source electrode and a drain electrode disposed in the reflection region and respectively corresponding to two opposite sides of the gate electrode;
an extension electrode electrically connected to the drain electrode and extending to a part of the transmission region;
a fourth metal electrode disposed in the reflection region, the fourth metal electrode being electrically connected to the drain electrode and the third metal electrode, wherein the fourth metal electrode partially overlaps with the first metal electrode to form a storage capacitor;
a fifth metal electrode disposed in the reflection region, the fifth metal electrode being floating, wherein the fifth metal electrode partially overlaps with the third metal electrode to form a coupling capacitor, and the fifth metal electrode partially overlaps with the second metal electrode to form a modulating capacitor;
a second dielectric layer disposed on the first dielectric layer and the second metal pattern;
a reflection electrode disposed on the second dielectric layer in the reflection region, wherein the reflection electrode is electrically connected to the fifth metal electrode; and
a transmission electrode disposed on the second dielectric layer in the transmission region, wherein the transmission electrode is electrically connected to the extension electrode.

2. The pixel structure of a TR-LCD panel of claim 1, further comprising:
a second substrate disposed opposite to the first substrate;
a liquid crystal layer disposed between the first substrate and the second substrate; and
a common electrode disposed on the second substrate, wherein the transmission electrode and the common electrode form a first liquid crystal capacitor, and the reflection electrode and the common electrode form a second liquid crystal capacitor.

3. The pixel structure of a TR-LCD panel of claim 2, wherein the common electrode has the first voltage.

4. The pixel structure of a TR-LCD panel of claim 1, wherein the first dielectric layer has a first contact hole exposing a part of the third metal electrode, and the fourth metal electrode is electrically connected to the third metal electrode via the first contact hole of the first dielectric layer.

5. The pixel structure of a TR-LCD panel of claim 1, wherein the second dielectric layer has a second contact hole exposing a part of the fifth metal electrode, the second dielectric layer has a third contact hole exposing a part of the extension electrode, the reflection electrode is filled in the second contact hole and electrically connected to the fifth metal electrode, and the transmission electrode is filled in the third contact hole and electrically connected to the extension electrode.

6. The pixel structure of a TR-LCD panel of claim 1, wherein the second dielectric layer comprises an inorganic dielectric layer and an organic dielectric layer from bottom to top.

7. The pixel structure of a TR-LCD panel of claim 6, wherein the organic dielectric layer disposed in the reflection region has a rough surface, and the reflection electrode disposed on the organic dielectric layer has a rough surface.

8. The pixel structure of a TR-LCD panel of claim 1, further comprising an amorphous silicon (a-Si) semiconductor layer disposed on the first dielectric layer and corresponding to the gate electrode.

9. The pixel structure of a TR-LCD panel of claim 1, wherein the TR-LCD panel comprises a single cell gap TR-LCD panel.

10. A method of forming a TR-LCD panel, comprising:
providing a first substrate, the first substrate having a reflection region and a transmission region defined thereon;
forming a first metal pattern on the first substrate, the first metal pattern comprising:
a gate electrode disposed in the reflection region;
a first metal electrode disposed in the reflection region;
a second metal electrode disposed in the reflection region;
a third metal electrode disposed in the reflection region;
forming a first dielectric layer on the first substrate and the first metal pattern, and forming a first contact hole in the first dielectric layer to expose a part of the third metal electrode;
forming a second metal pattern on the first dielectric layer, the second metal pattern comprising:
a source electrode and a drain electrode disposed in the reflection region and respectively corresponding to two opposite sides of the gate electrode;
an extension electrode electrically connected to the drain electrode and extending to a part of the transmission region;
a fourth metal electrode disposed in the reflection region, the fourth metal electrode electrically connected to the drain electrode, the fourth metal electrode electrically connected to the third metal electrode via the first contact hole of the first dielectric layer, wherein the fourth metal electrode partially overlaps with the first metal electrode, and the fourth metal electrode and the first metal electrode form a storage capacitor;
a fifth metal electrode disposed in the reflection region, wherein the fifth metal electrode partially overlaps with the third metal electrode, the fifth metal electrode and the third metal electrode form a coupling capacitor, the fifth metal electrode partially overlaps with the second metal electrode, and the fifth metal electrode and the second metal electrode form a modulating capacitor;
forming a second dielectric layer on the first dielectric layer and the second metal pattern, and forming a second contact hole and a third contact hole in the second dielectric layer to respectively expose a part of the fifth metal electrode and a part of the extension electrode;
forming a reflection electrode on the second dielectric layer in the reflection region, wherein the reflection electrode is filled in the second contact hole, and the reflection electrode is electrically connected to the fifth metal electrode; and
forming a transmission electrode on the second dielectric layer and in the transmission region, wherein the transmission electrode is filled in the third contact hole and electrically connected to the extension electrode.

11. The method of claim 10, wherein the steps of forming the second dielectric layer comprising:
forming an inorganic dielectric layer on the first dielectric layer and the second metal pattern;
forming an organic dielectric layer on the inorganic dielectric layer; and
forming the second contact hole and the third contact hole.

12. The method of claim 11, further comprising making the organic dielectric layer disposed in the reflection region has a rough surface so that the reflection electrode subsequently formed on the organic dielectric layer also has a rough surface.

13. The method of claim 10, further comprising forming an amorphous silicon (a-Si) semiconductor layer on the first dielectric layer before forming the second metal pattern, and the a-Si semiconductor layer is corresponding to the gate electrode.

* * * * *